United States Patent [19]

Schmitz

[11] Patent Number: 4,792,672

[45] Date of Patent: Dec. 20, 1988

[54] DETECTOR BUFFER BOARD

[75] Inventor: Charles E. Schmitz, Irvine, Calif.

[73] Assignee: Grumman Aerospace Corporation, Bethpage, N.Y.

[21] Appl. No.: 34,143

[22] Filed: Mar. 23, 1987

Related U.S. Application Data

[63] Continuation-in-part of Ser. No. 907,408, Sep. 15, 1986, which is a continuation-in-part of Ser. No. 722,776, Apr. 12, 1985, Pat. No. 4,618,763.

[51] Int. Cl.⁴ .................. H01L 27/14; H05K 1/14; H01J 40/14
[52] U.S. Cl. .................. 250/211 R; 250/338.1; 250/578
[58] Field of Search ............... 250/211 R, 209, 332, 250/338, 370, 578

[56] References Cited

U.S. PATENT DOCUMENTS

| | | | |
|---|---|---|---|
| 2,879,977 | 3/1959 | Trought | 257/263 |
| 3,183,121 | 5/1965 | Moeller | 136/4 |
| 3,378,357 | 4/1968 | Alban | 29/183.5 |
| 3,378,622 | 4/1968 | Marin | 13/18 |
| 3,510,362 | 5/1970 | Charland et al. | 136/202 |
| 3,852,714 | 12/1974 | Carson | 250/203 R X |
| 3,970,990 | 7/1976 | Carson | 250/208 X |
| 4,019,388 | 4/1977 | Hall, II et al. | 73/398 |
| 4,081,819 | 3/1978 | Wong | 357/30 |
| 4,152,175 | 5/1979 | Burgess et al. | 136/89 PC |
| 4,283,755 | 8/1981 | Tracy | 361/414 X |
| 4,304,624 | 12/1981 | Carson et al. | 250/239 X |
| 4,305,088 | 12/1981 | Narita et al. | 357/79 |
| 4,315,591 | 2/1982 | Houston | 228/188 |
| 4,352,715 | 10/1982 | Carson et al. | 156/634 |
| 4,354,107 | 10/1982 | Carson et al. | 250/578 X |
| 4,361,717 | 11/1982 | Gilmore et al. | 136/246 |
| 4,403,238 | 9/1983 | Clark | 357/76 X |
| 4,525,921 | 7/1985 | Carson et al. | 250/553 X |
| 4,551,629 | 11/1985 | Carson et al. | 250/578 |
| 4,592,029 | 5/1986 | Altmann et al. | 250/578 X |
| 4,618,763 | 10/1986 | Schmitz | 250/211 R |
| 4,646,128 | 2/1987 | Carson et al. | 250/370 X |
| 4,659,931 | 4/1987 | Schmitz | 250/338 |
| 4,675,532 | 6/1987 | Carson | 250/578 |

FOREIGN PATENT DOCUMENTS 965346 11/1962 United Kingdom .

Primary Examiner—Eugene R. LaRoche
Assistant Examiner—David Mis
Attorney, Agent, or Firm—Stetina and Brunda

[57] ABSTRACT

An infrared detection system is disclosed comprising a planar array segment of infrared detector elements, a multi-layer module and a buffer board disposed intermediate the detector array segment and the multi-layer module. The buffer board is disposed parallel to the planar array segment of detector elements and transverse to the plane of the module layers. The buffer board is disposed in abutting electrical connection with the detector elements and conductive patterns formed on the multi-layer module. The buffer board facilitates electrical communication between the detector elements and the module and conductive patterns formed on the module layers, and also enhances the structural characteristics and separate testability of the system components.

24 Claims, 1 Drawing Sheet

DETECTOR BUFFER BOARD

The present application is a continuation-in-part of co-pending application Ser. No. 907,408, filed Sept. 15, 1986, which is a continuation-in-part of application Ser. No. 722,776, filed 4/12/85, now U.S. Pat. No. 4,618,763.

BACKGROUND OF THE INVENTION

The present application relates to components for interfacing a plurality of detector elements to detector modules. More particularly, the invention relates to means for interfacing thin film detector elements to a multi-layer structure having layers disposed transverse to the plane to the detector elements.

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, as well as advances in semiconductor materials and highly sensitive electronic circuitry have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analysing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on a side, with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

Where the array material is very thin, less than 0.005 inches, difficulties arise in attaching the array material to the face of the module. Such difficulties may be attributed to a variety of reasons including the inability of the detector material to absorb forces generated by the mismatched coefficient of expansion between the module and the array material. This mismatch in the expansion coefficients is particularly problematical where the detector is formed of material such as solid state recrystallized bulk mercury cadmium telluride.

Additional difficulties have been encountered in providing a means for testing the reliability of the individual detector elements. Where the detector material is applied directly to the module body it is difficult to isolate a fault that may be attributable to either the detector elements, module wiring or processing elements. Where the detector elements are not testable apart from the module body the testing and assembly process becomes substantially less reliable and result in the production of assemblies that may be useless or expensive to repair.

The present invention is directed to the construction that remedies these and other deficiencies in the construction of contemporary infrared detector modules. The invention provides a technique in construction that facilitates testability of the detector elements prior to securing the elements to the connecting module. The invention also provides a structure that reduces the sensitivity of the detector material to expansion or contraction of the detector module.

SUMMARY OF THE INVENTION

An infrared detection system is disclosed comprising a planar array segment of infrared detector elements, a multi-layer module and a buffer board disposed intermediate the detector array segment and the multi-layer module. The buffer board is disposed parallel to the planar array segment of detector elements and transverse to the plane of the module layers. The buffer board is disposed in abutting electrical connection with the detector elements and conductive patterns formed on the multi-layer module. The buffer board facilitates electrical communication between the detector elements and the module and conductive patterns formed on the module layers, and also enhances the structural characteristics and separate testability of the system components.

The buffer board may be formed of any of a plurality of materials such as alumina (single or polycrystaline), ceramics, galium arsenide or silicon.

The buffer board may be formed to have conductive regions extending therethrough, wherein the conductive regions have center line spacing of between 0.002 and 0.020 inches. The thickness of the buffer board may be between 0.002 and 0.010 inches. In the presently preferred embodiment the buffer board is formed to have conductive regions having center line spacing of between 0.002 and 0.004 inches, and formed to be between 0.002 and 0.004 inches thick.

DETAILED DESCRIPTION OF THE DRAWING

The detailed description set forth below in connection with the appended drawings is intended merely as a description of the presently preferred embodiment of the invention, and is not intended to represent the only form in which the present invention may be constructed or utilized. The description sets forth the functions and steps for installing the invention, in connection with the illustrated embodiment. It is to be understood, however, that the same, or equivalent functions or advantages may be accomplished by different embodiments that are also intended to be encompassed within the spirit and scope of the invention.

Figure 1:
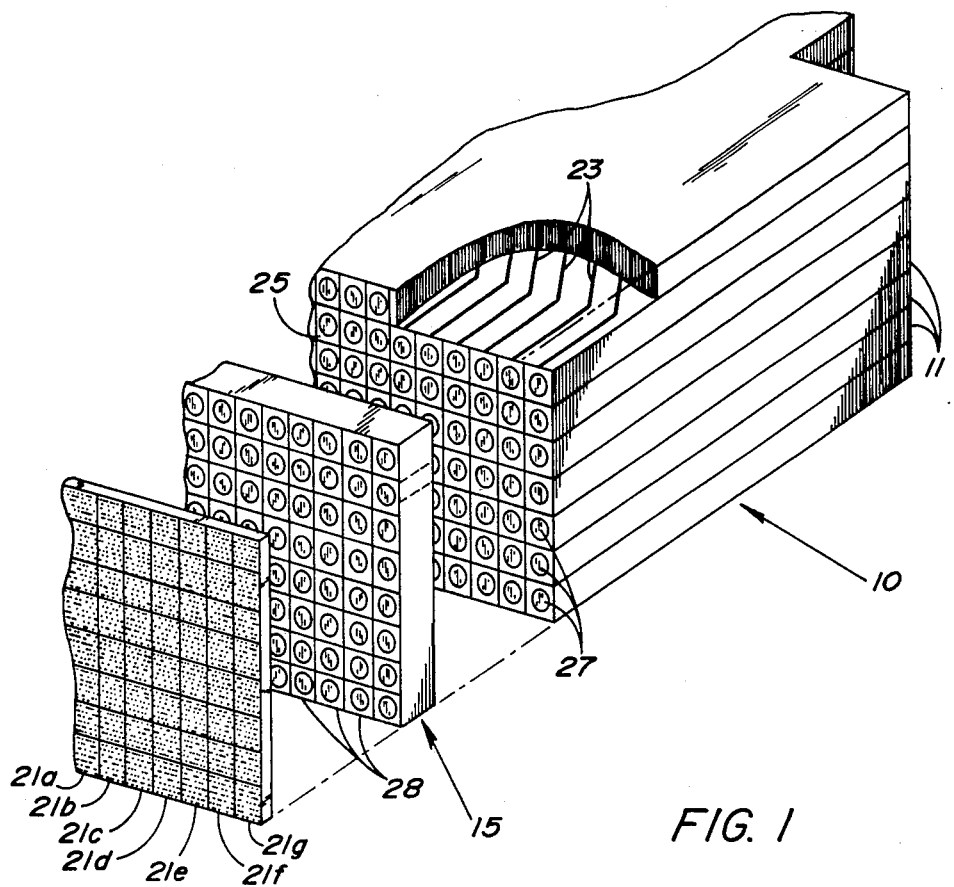
FIG. 1 is an exploded perspective view of one embodiment of the invention.

As shown at FIG. 1 an exemplary module 10 is formed by a plurality of layers 11 stacked in substantially overlapping registry. Such modules typically support conductive patterns for communicating signals from each of the detector elements, e.g. 21a-g to circuitry (not shown) for receiving and processing the signals from each detector element. Each layer 11 may comprise or include integrated circuits, e.g. formed on or connected to conductive patterns on the layers. Such integrated circuit is preferably formed as multi-channel devices adapted to receive signals from one of the detector elements, processed to receive signals and communicate the processed signals to external electronics. Circuitry suitable for performing the receiving and buffering functions of such integrated circuits is disclosed in U.S. Pat. No. 4,633,086, by William J. Parrish, entitled INPUT CIRCUIT FOR INFRARED DETECTOR, assigned to the common assignee. It should be noted, however, that various alternate input and processing circuits may be used to implement the functions of the integrated circuits without departing from the spirit or scope of the claimed invention. Indeed, the present invention more particularly relates to means for connecting the detector array to the module, and therefore may be implemented in modules that have no processing capacity at all. The layers 11 may be formed of any of a plurality of materials such as alumina (single or polycrystaline), ceramics, glass, galium arsenide or silicon.

Referring again to FIG. 1, Each of the circuit layers 11 is provided with conductors 23 extending to first edge portions 25 of the layers 11. As shown at FIG. 1 bump bond connectors 27, e.g., metalized pads are formed on first edge portion 25 of each of the layers 11. Other types of connectors may be formed on first edge portions 25 in accordance with a variety of well known techniques. The connectors 27 facilitate electrical contact between the conductors 23, formed on the layers 11, and connectors formed on the buffer board 15, as described below.

An exemplary infrared detector array segment 17 is formed of a plurality of discrete detector elements 21a-g. Each element 21 is connectable to a dedicated conductor 23 through dedicated connectors 28 formed on the buffer board 15, and a dedicated connector 27 formed on the edge portions of the layers 11. Because of the brittleness of the detector array segment and the potential for cracking when secured to a module characterized by temperature responsive to changes in dimensions, it has been found that direct connection of the detector array segment 17 to the module 10 is unadvisable. In addition to potential for damage to the detector array segment in response to temperature changes, direct connection to the module makes testing of the detector array segment and fault isolation in the module extremely difficult. Once the detector array segment is secured to the module testing of the detector array segment requires that the module circuitry be completely reliable. Faults in the module circuitry therefore indistinguishable from faults in the detector array elements. In view of the cost of the detector array segments, the modules, and the need for precise handling and mating the detector array segment and modules, the failure to provide separate testability is unacceptable. Therefore, in accordance with the present invention, a buffer board 15 is provided which is disposed intermediate the detector array segment 17 and module 10. The buffer board 15 provides a mechanical buffer for absorbing strains associated with changes in the dimensions of module 10 thereby reducing the potential for mechanical failure of the detector array segment in response to those changes. In addition to the mechanical buffering function, buffer board 15 is also useful to provide a support structure for detector array segment 17 to facilitate testing of individual detector elements prior to connecting the detector array segment 17 to the module 10. The buffer board 15 may also be connected to the module 10 to facilitate separate testing of the module 10. Although in the presently preferred embodiment only one buffer board is disposed intermediate the detector array segment 17 and the module 10, it is anticipated that more than one buffer board may be so disposed in order to facilitate separate testing of all portions of the complete module assembly. The buffer board 15 is formed to have conductive regions extending therethrough. The conductive regions terminate in first and second conductive portions, e.g. conductive portions 28, disposed on opposite surfaces of the buffer board. The conductive portions 28 typically extend slightly from the surface of the buffer board to facilitate electrical contact with the detector elements and the module.

It is to be understood that the advantages of relieving mechanical strain inherent in the present invention may be accomplished by initially connecting the buffer board 15 to either the module 10 or to the detector array segment 17. However, by initially connecting the buffer board 15 to the detector array segment 17 the invention provides additional advantages with respect to separate testability of individual detector elements prior to connection to the module 10. In view of the delicate nature of the detector array segment 17, such testability cannot be provided without the use of a supporting surface, such as buffer board 15. A variety of soldering techniques (solder-bump reflow, solder cream fusion or flip chip bonding techniques) may be used to join the detector array segment 17 to the buffer board 15, and the buffer board 15 to the module 10.

The detector elements 21 may be formed of any of a plurality of photovoltaic materials such as HgCdTe, Pt-Si or InSb, or photo conductive materials such as PbS. A desired center line spacing between adjacent elements is typically a function of the intended application of the performance of the detector array. It is anticipated that the present invention is likely to find the most common application in connection with infrared detector elements having center line spacing between 0.002 and 0.020 inches, though the invention is not limited to use with arrays in that range. In the presently preferred embodiment the center line spacing between detector elements is approximately between 0.002 and 0.004 inches.

The thickness of the layers of the module is designed in view of the detector center line spacing requirements. It is anticipated that the thickness of the layers 10 will, in practice, commonly be between 0.002 and 0.020 inches. Further details concerning exemplary constructions of module 10 are set forth in copending patent applications Ser. Nos. 731,988 and 907,408, assigned to the common assignee.

Figure 2:
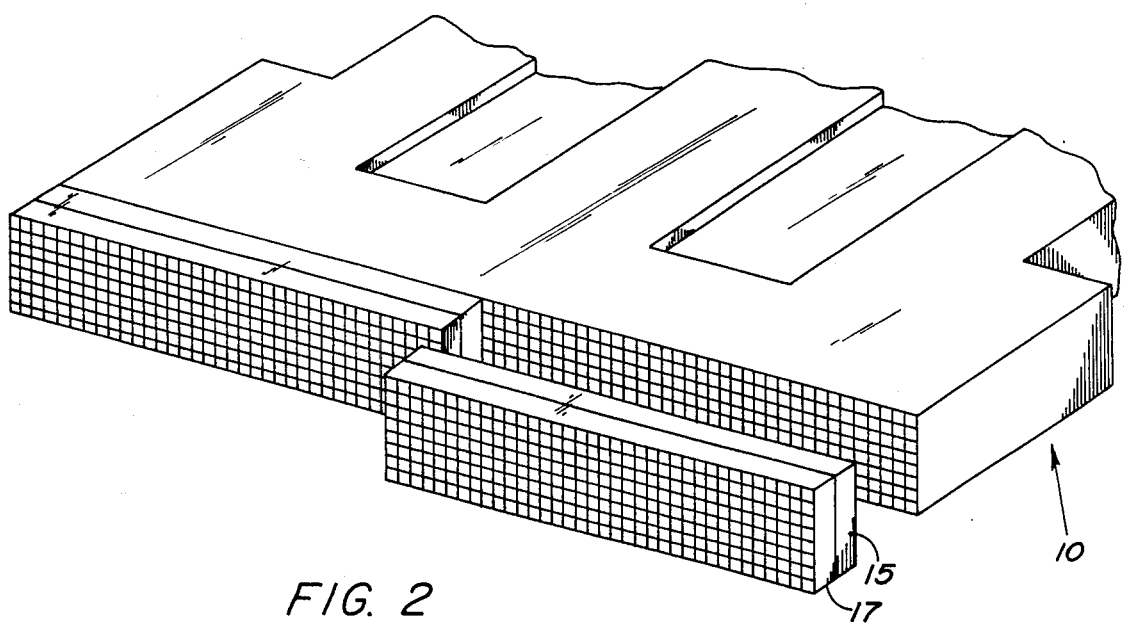
FIG. 2 is a perspective view of the buffer board connected to a detector array segment.

FIG. 2 illustrates a construction wherein the buffer board 15 is initially connected to a detector array segment 17, prior to connecting the buffer board 15 to the module 10. As indicated, such an arrangement facilitates testing of elements of the detector array 17 prior to connection to the module 10.

Buffer board 15 may be formed of any of a plurality of materials such as alumina (single or polycrystaline), ceramics, glass ceramics, galium arsenide or silicon. In order to provide conductive paths through the buffer board 15 holes may be formed in the buffer board by means of a laser drill, chemical etching, or other processes such as diffusion or doping. The conductive paths through buffer board 15 are provided with raised surfaces in order to facilitate contact with connectors 27, formed on edge portions of layer 11, and to the detector elements forming detector array segment 17. The conductive areas formed on and through the buffer board consistent with the spacing of the detector elements, i.e. between 0.002 and 0.020 inches spacing. The thickness of the buffer board 15 may typically be between 0.002 and 0.010 inches. In the presently preferred embodiment the buffer board is between 0.002 and 0.004 inches.

In practice, the buffer board 15 is used to determine whether individual elements of the detector array segment are operating properly. Upon connecting conductive portions 28 of the buffer board 15 to the infrared detector array elements 21 (such that each detector array element is connected to a separate connector of the buffer board) the detector array segment 17 is illuminated by a source of infrared frequency light and the signals appearing on the opposite side of the buffer board 15 are monitored for appropriate output levels. If the detector elements are operating properly and properly connected to the buffer board, the assembly may then be connected to the module.

Aside from its usefulness to facilitate testing of the detector array segment, the buffer board may be used to facilitate testing of the module as well. In some cases the buffer board may be more readily testable than the face of the module, serve to limit damage to the module contacts, and/or include wiring that facilitates the injection of test signals into the module. By connecting the buffer board to the module test input signals may be applied to the buffer board and outputs from the module measured to determine whether the module is operating properly. If desired, two buffer boards may be used. The first may be applied to the detector array segment to facilitate testing of the detector array segment, and the second may be applied to the module to facilitate testing of the module. The mating surfaces of the two buffer boards may then be connected together.

As described above, it is anticipated that numerous variations and modifications of the presently preferred embodiment may be made without departing from the present invention. Accordingly, it should be understood that the form of the invention described above and shown in the accompanying drawings is exemplary of only the presently preferred embodiment and is not intended to limit the scope of the present invention.

What is claimed is:

1. An infrared detection system comprising:
   an planar array segment of infrared detector elements;
   a multi-layer module for communicating signals from said detector array segment to external electronics, each of said layers being disposed in a plane transverse to said planar array segment and having a plurality of conductors formed thereon; and
   a buffer board disposed intermediate said detector array segment and said multi-layer module, said buffer board being disposed parallel to said planar array segment, said buffer board being in abutting electrical connection with said detector elements and said conductive patterns formed on said multi-layer module.

2. The system as recited in claim 1 wherein said buffer board comprises an insulating substrate having a plurality of conductive regions extending therethrough, said conductive regions including first conductive portions in electrical communication with a dedicated detector element and second conductive portions in electrical communication with a dedicated conductor formed on one of said layers.

3. An infrared detection system as recited in claim 1 wherein said buffer board is formed of alumina.

4. An infrared detection system as recited in claim 3 wherein said buffer board is formed of single crystaline alumina.

5. An infrared detection system as recited in claim 3 wherein said buffer board is formed of polycrystaline alumina.

6. An infrared detection system as recited in claim 1 wherein said buffer board is formed of ceramic material.

7. An infrared detection system as recited in claim 1 wherein said buffer board is formed of silicon.

8. An infrared detection system as recited in claim 1 wherein said buffer board is formed of galium arsenide.

9. An infrared detection system as recited in claim 2 wherein said conductive regions are disposed to have a center line spacing of between 0.002 and 0.020 inches.

10. An infrared detection system as recited in claim 2 wherein said conductive regions are disposed to have a center line spacing of between 0.002 and 0.004 inches.

11. The infrared detection system as recited in claim 2 wherein said buffer board is between 0.002 and 0.010 inches thick.

12. A process of forming an infrared detection system comprising:
   forming a first planar detection array segment having a plurality of detector elements;
   forming a multi-layer conductive module each of said layers extending transverse to said array segment and having electrical conductors formed thereon;
   forming a buffer board, said buffer board having first conductive portions connectable to said detector elements, and second conductive portions connectable to said module conductors;
   connecting said buffer board to said detector elements such that said first conductive portions are in electrical communication with said detector array segments;
   illuminating said infrared detector array segment with a source of infrared frequency light;
   monitoring signals appearing at said buffer board second conductive regions to determine the operating characteristics of said detector elements; and
   connecting said buffer board second conductive portions to said module conductors.

13. A detector buffer board for use in an infrared detection system comprising:
   a non-conductive substrate having a plurality of conductive regions extending therethrough, said conductive regions having first portions connectable to individual elements of a detector array segment, and second portions, disposed opposite said first portions and connectable to conductors formed on a multi-layer module, said layers being disposed transverse the plane of said substrate.

14. The buffer board as recited in claim 13 wherein said conductive regions are disposed to have center line spacing of between 0.002 inches and 0.020 inches.

15. The buffer board as recited in claim 13 wherein said conductive regions are disposed to have a center line spacing of between 0.002 and 0.004 inches.

16. The buffer board as recited in claim 13 wherein said substrate is formed of alumina.

17. The buffer board as recited in claim 13 wherein said substrate is formed of single crystaline alumina.

18. The buffer board as recited in claim 13 wherein said substrate is formed of polycrystaline alumina.

19. The buffer board as recited in claim 13 wherein said substrate is formed of a ceramic material.

20. The buffer board as recited in claim 13 wherein said substrate is formed of silicon.

21. The buffer board as recited in claim 13 wherein said substrate is formed of galium arsenide.

22. The buffer board as recited in claim 13 wherein said substrate is formed to be between 0.002 and 0.010 inches thick.

23. The buffer board as recited in claim 13 wherein said substrate is formed to be between 0.002 and 0.004 inches thick.

24. A process of relieving mechanical strain on a detector array segment connected to a multi-layer module, said process comprising:
   forming a buffer board having an array of conductive regions extending therethrough, transverse to the plane of said buffer board;
   connecting a first surface of said buffer board to said detector array segment such that each of said conductive regions is in electrical communication with an individual detector element of said array segment; and
   connecting a second surface of said buffer board to said module such that each of said conductive regions is in electrical communication with a dedicated conductor formed on one of said layers.

* * * * *